United States Patent [19]

Ngai et al.

[11] Patent Number: 4,692,633
[45] Date of Patent: Sep. 8, 1987

[54] EDGE SENSITIVE SINGLE CLOCK LATCH APPARATUS WITH A SKEW COMPENSATED SCAN FUNCTION

[75] Inventors: Chuck H. Ngai, Endwell; Gerald J. Watkins, Endicott, both of N.Y.

[73] Assignee: International Business Machines Corporation, Armonk, N.Y.

[21] Appl. No.: 627,268

[22] Filed: Jul. 2, 1984

[51] Int. Cl.[4] .................... H03K 19/00; H03K 19/02; H03K 5/13
[52] U.S. Cl. .................................. 307/269; 307/445; 307/480; 328/63; 371/25
[58] Field of Search ............... 307/269, 445, 480, 510, 307/289, 272 A, 272 R, 529, 247 R; 328/72, 63; 371/25

[56] References Cited

U.S. PATENT DOCUMENTS

| | | | |
|---|---|---|---|
| 3,679,915 | 7/1972 | Kriger | 307/445 |
| 3,806,891 | 4/1974 | Eichelberger et al. | 340/172.5 |
| 4,229,699 | 10/1980 | Fussell | 307/269 |
| 4,277,699 | 7/1981 | Brown et al. | 307/272 |
| 4,359,718 | 11/1982 | Payen | 307/269 |
| 4,554,466 | 11/1985 | Dillon | 307/272 A |

OTHER PUBLICATIONS

"Single Clock Shift Register Latch", T. W. Williams, IBM Technical Disclosure Bulletin, vol. 16, No. 6, Nov. 1973, p. 1961.
"D-Type Latch", Y. K. Puri et al., IBM Technical Disclosure Bulletin, vol. 24, No. 8, Jan. 1982, p. 4365.
"LSSD Compatible D-Function Latch", F. J. Canova et al., IBM Technical Disclosure Bulletin, vol. 25, No. 10, Mar. 1983, pp. 5196-5198.

Primary Examiner—Stanley D. Miller
Assistant Examiner—Timothy P. Callahan
Attorney, Agent, or Firm—John H. Bouchard

[57] ABSTRACT

A latch circuit possesses a scan capability, has a single clock input line, and possesses a locking feature whereby input data, once locked in the latch, is insensitive to further changes in state of the input data. The latch also possesses a novel selection apparatus which functions to select either a scan data input line or a system data input line in accordance with the binary state of a system gate input line, the selection apparatus developing an output signal, the binary state of which is locked in the latch in response to a predetermined state of a clock pulse conducted via the single clock line. Clock skew compensation is provided via the locking feature. During a scan mode, clock skew compensation is provided when the clock pulse is received for a period of time after termination of reception of a scan pulse conducted via the system gate input line.

5 Claims, 7 Drawing Figures

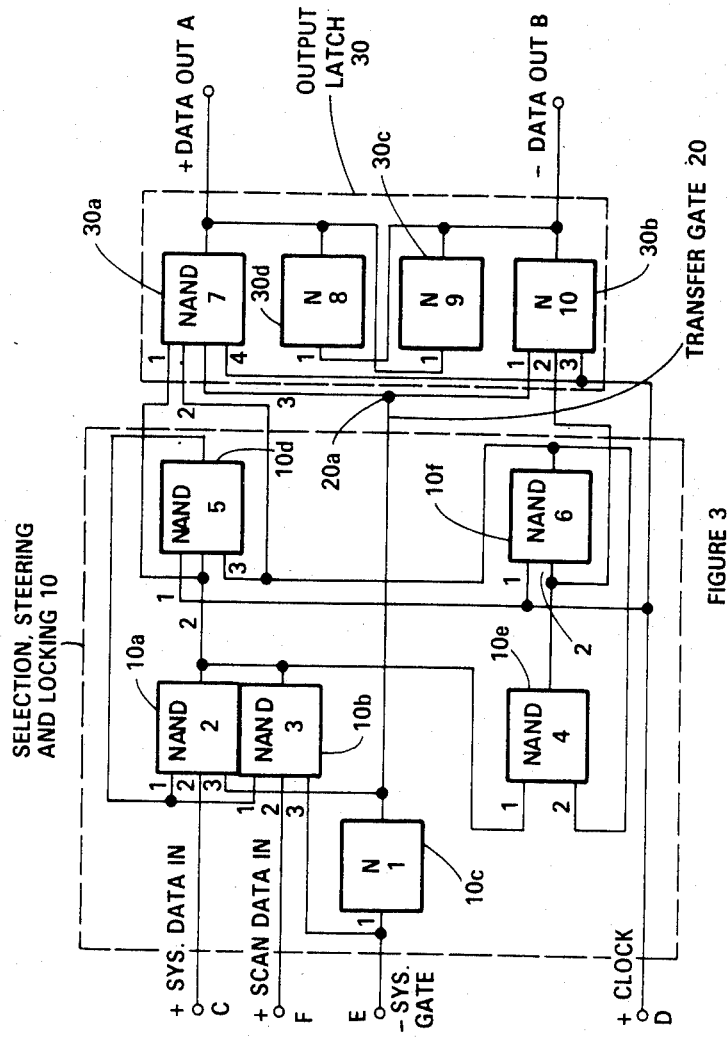

EDGE SENSITIVE SINGLE CLOCK LATCH APPARATUS WITH A SKEW COMPENSATED SCAN FUNCTION

BACKGROUND OF THE INVENTION

1. Field of the Invention

The present invention is directed to an improved latch circuit for use with computing systems and, more particularly, an edge sensitive single clock latch with a skew compensated scan function.

2. Description of the Prior Art

The integrated circuits used in modern day computing systems include a plurality of latch circuits. The latch circuit is required to function in association with a scan capability. If a latch circuit possesses a scan capability, when the scan capability is utilized, the binary state of the latch circuit is read and recorded in a register along with the binary states of the other latch circuits. The contents of the register may then be read and displayed on a display screen for the purpose of comparing the binary states of the latch circuits with a set of correct binary states. In this fashion, erroneous data may be easily detected.

For example, referring to FIGS. 1a and 1b, a typical latch-scan arrangement is illustrated. In FIG. 1a, latch L2 is connected to the output of latch L1. Latch L3 is connected to the output of latch L2. Latch L4 is connected to the output of latch L3. Latch L5 is connected to the output of latch L4. Latch L6 is connected to the output of latch L5. Scan data is input to latch L1. A signal "A" energizes an input terminal of latches L1, L3, and L5. A signal "B" energizes an input terminal of latches L2, L4, and L6. The output of latch L6 is connected to an input of a register. The register is connected to a cathode-ray-tube (CRT) and associated circuitry for reading the contents of the register and displaying the register-contents on the CRT. FIG. 1b illustrates the voltage waveforms associated with signals A and B. In operation, referring to FIG. 1a in conjunction with FIG. 1b assume that a binary bit, representing the contents of latch L1, is stored within latch L1. In response to the first B signal pulse, the binary bit is moved to latch L2. In response to the first A signal pulse, the binary bit is moved to latch L3. In response to the second B signal pulse, the binary bit is moved to latch L4. In response to the second A signal pulse, the binary bit is moved to latch L5. In response to the third B signal pulse, the binary bit is moved to latch L6. In response to the third A signal pulse, the binary bit is moved to position "1" of the register. Other binary bits, representative of the contents of latches L2 through L6, have already been input to the register in a similar fashion. Therefore, the register is filled with binary bits representing the contents of latches L1 through L6. The register may be interrogated for its contents in order to study the binary bits thereby determining the operational condition of latches L1 through L6.

A typical prior art latch utilized for this purpose is the so-called polarity-hold level-sensitive-scan-design (LSSD) latch. The LSSD latch possesses the scan capability. However, this latch utilizes a multiple number of clocks to implement the scan capability. A multiple number of clocks is undesirable, from a designer's point of view, because each of these clock lines must be disposed on an integrated circuit chip. From the designer's point of view, it would be more desirable to utilize only one clock line.

Another type of latch which exists in the prior art is a so-called "D" type latch. The D-type latch is desirable, from a designer's point of view, because it is edge-sensitive to a clock pulse controlling the latch, that is, the binary state of the latch is changed in response to the leading edge of the clock pulse controlling the latch. Another desirable feature of the D-type latch is that it locks the data being input thereto at its present value prior to immediately transferring the locked data to an output latch. Therefore, the data cannot be changed in response to further changes in the input data state. Still another desirable feature of the D-type latch is that it utilizes only one clock to perform its function. However, a major disadvantage associated with the D-type latch is that it does not possess the above referenced scan capability. Therefore, the contents of the D-type latch cannot be checked and verified utilizing the scan feature.

Clocking is important in the functioning of a latch because it controls the latch function. However, when a multiple number of clocks are utilized to control the functioning of the latch, another problem is presented, that is, a so-called "skew" problem.

Clock skew is a problem when operating in the scan mode. In the scan mode, binary data from one latch, destined for storage in the register of FIG. 1a, must be stored in the next-sequentially disposed latch. However, the storage of this data is dependant upon the receipt of a clock pulse via a clock line. If a binary 1, for example, is ready for storage in the next-sequentially disposed latch, but the clock pulse is not received (due to various conditions associated with the clock pulse generator), the binary 1 will not be stored in the latch. When the clock pulse is received, the binary 1 may have been changed to a binary 0. In this case, a binary 0 will be stored in the next-sequentially disposed latch. Consequently, erroneous data is disposed within the register referenced above associated with the typical latch-scan arrangement of FIG. 1a.

The D-type latch has been modified to include the scan capabiltity associated with the LSSD type latch. However, the modified, reconstructed latch possessed a multiple number of clock lines, normally associated with the LSSD latch, needed to control its system functioning. This multiple number of clock lines is undesirable, from the designer's viewpoint, since it is difficult to implement this latch utilizing integrated circuit technology. Furthermore, unless the generation and the timing of the clock pulses, associated with the multiple number of clock lines, is carefully controlled, the clock skew problem is still present.

SUMMARY OF THE INVENTION

Accordingly, it is a primary object of the present invention to provide a new improved latch circuit which possesses the advantages associated with the LSSD latch and the advantages associated with the D-type latch but without also possessing the disadvantages associated with either the LSSD latch or the D-type latch.

It is a further object of the present invention to provide a new improved latch circuit which possesses a scan capability normally associated with the LSSD latch, a minimum number of clock lines normally associated with the D-type latch, and a clock skew compensation feature capable of compensating for the skew problem normally associated with latch circuits utilizing multiple clocks.

These and other objects of the present invention are accomplished by providing a latch circuit which possesses the locking and steering feature associated with the D-type latch, the single clock line associated with the D-type latch, and the scan capability associated with the LSSD latch, and which also possesses a novel selection capability for selecting scan data when utilizing the scan capability during a scan mode of operation or for selecting system data when not utilizing the scan capability during a system mode of operation. During the system mode of operation, the latch circuit selects an input data state, steers the input data state to the input of an output latch and, in response to a clock pulse transmitted via a single clock line, locks the input data state, appearing at the input of the output latch, at the value it possessed when the clock line became plus in order to render the binary state or condition of the output latch insensitive to further changes in state or condition of the data input to the latch. The input data is automatically transferred to the output latch, during the system mode of operation, since a pulse is always being transmitted via a system gate. During a scan mode of operation, the input data state, appearing at the input of the output latch, becomes locked as it did during the system mode of operation. However, during the scan mode, the latch circuit transfers the input data state to the output latch in response to a scan pulse which is transmitted via the system gate during the active transmission of the clock pulse thereby changing the previous binary state or condition of the output latch. When the scan pulse is removed, the clock pulse is allowed to continue for a sufficient time in order to compensate for clock skew, the so-called skew problem. When the clock pulse is removed, further input data may be selected for further steering and transfer to the output latch as indicated above.

Further scope of applicability of the present invention will become apparent from the detailed description presented hereinafter. It should be understood, however, that the detailed description and the specific examples, while representing a preferred embodiment of the invention, are given by way of illustration only, since various changes and modifications within the spirit and scope of the invention will become obvious to one skilled in the art from a reading of the following detailed description.

BRIEF DESCRIPTION OF THE DRAWINGS

A full understanding of the present invention will be obtained from the detailed description of the preferred embodiment presented hereinbelow, and the accompanying drawings, which are given by way of illustration only and are not intended to be limitative of the present invention, and wherein:

FIG. 3 illustrates a detailed construction of one embodiment of the latch circuit illustrated in FIG. 2;

DETAILED DESCRIPTION OF THE PREFERRED EMBODIMENT

Figure 1A:
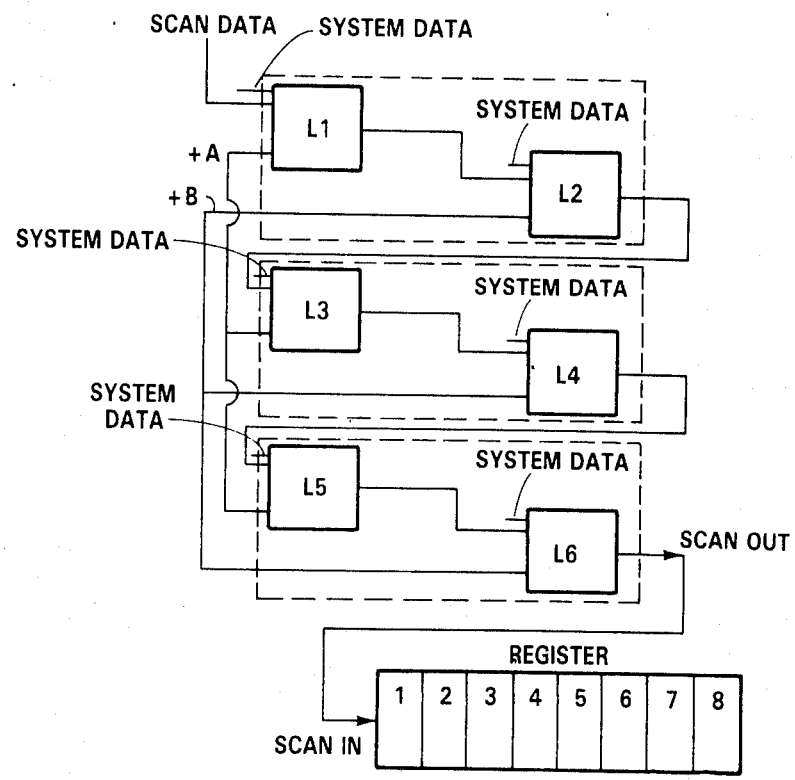
FIGS. 1a and 1b illustrate a prior art scan arrangement.
Figure 1B:
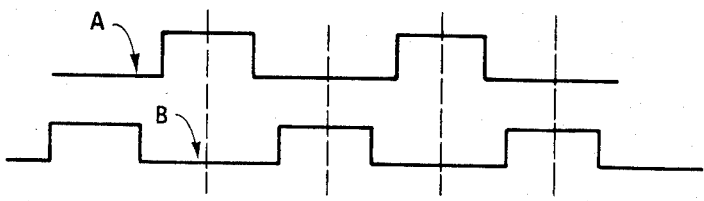
Figure 2:
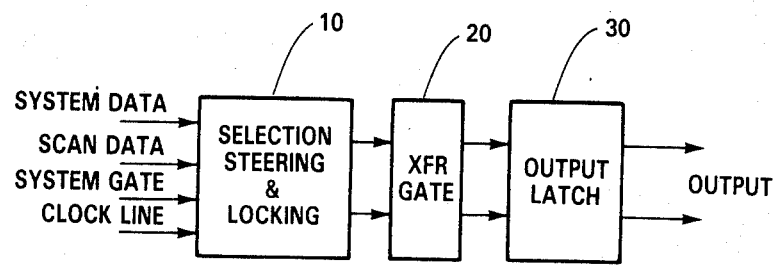
FIG. 2 illustrates a block diagram representing the improved latch circuit in accordance with the present invention.

Referring to FIG. 2, a block diagram of a latch circuit in accordance with the present invention is illustrated. In FIG. 2, the latch circuit of the present invention comprises a selection, steering, and locking means 10, an output latch 30, and a transfer gate 20 interposed between the selection, steering, and locking means 10 and the output latch 30.

In operation, referring to FIG. 2, while the latch circuit of the present invention is functioning during a system mode of operation, the selection, steering and locking means 10 receives or selects the system data from the system data input line, steers the system data to the input of the output latch 30, and, when a clock line becomes plus, the system data, appearing at the input of the output latch 30, is locked at the value it possessed when the clock line became plus. When a system gate line changes to a minus state, the system data, appearing at the input of the output latch 30, is immediately transferred from the input of the output latch 30 to the output latch 30. When the clock line becomes plus, the value of the binary state of the system data remains locked or fixed, despite changes in the value or binary state of the system data appearing on the system data input line, until the clock line is allowed to become minus.

Note that the selection, steering, and locking means 10 performs the locking function in response to clock pulses transmitted from the clock line. In accordance with one feature of the present invention, this clock line is the only clock line utilized by the latch circuit of the present invention.

When the latch circuit of the present invention is functioning during a scan mode of operation, the selection, steering and locking means 10 selects scan data from a scan data input line, stores the scan data within the locking means 10, steers the scan data to the input of an output latch 30, and, when a clock line becomes plus, locks the scan data energizing the input of the output latch 30 at the value it possessed when the clock line became plus. While the clock line is plus, a system gate is allowed to become minus. The scan data, at the input of the output latch 30, is transferred to the output latch 30. The output, binary state of the output latch 30 is changed accordingly.

When the system gate is minus, the latch circuit of the present invention is functioning during a system mode of operation. When the system gate is plus, the latch circuit of the present invention is functioning during a scan mode of operation.

The transfer gate 20 is connected to the system gate and allows the system data, appearing at the input of the output latch 30, to transfer to the output latch 30 during a system mode of operation and allows the scan data, appearing at the input of the output latch 30, to transfer to the output latch 30 during a scan mode of operation.

Referring to FIG. 3, a detailed construction of one embodiment of the latch circuit of FIG. 2 is illustrated.

In FIG. 3, the selection, steering, and locking means 10 comprises the following elements.

Figure 5:
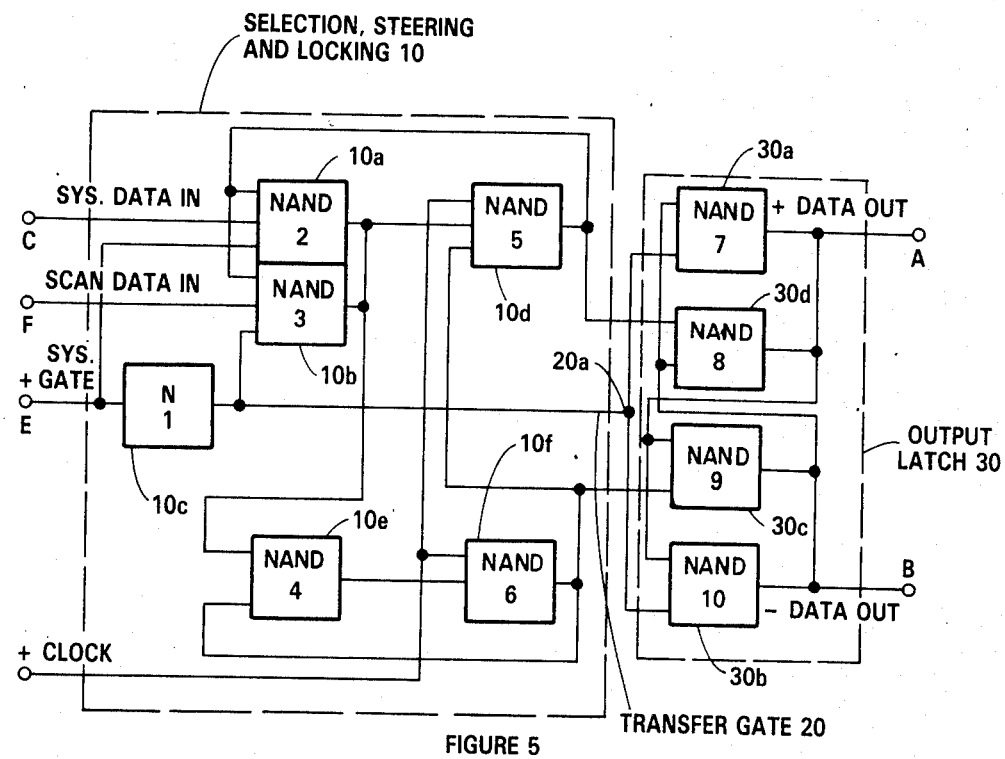
FIG. 5 illustrates a detailed construction of another embodiment of the latch circuit illustrated in FIG. 2.

For purposes of discussion with relation to FIGS. 3 and 5, an "and-invert (AI)" circuit and a "NAND" circuit are synonymous terms and are intended to refer to the same circuit configuration.

An and-invert circuit 10a includes input pins 1, 2, and 3. System data is received at pin 2 of the and-invert circuit 10a. An and-invert circuit 10b also includes input pins 1, 2, and 3. Scan data is received at pin 2 of the and-invert circuit 10b. An input terminal of an inverter 10c is connected to pin 3 of and-invert circuit 10b. The input terminal of inverter 10c is labelled "-system gate". An output terminal of the inverter 10c is connected to pin 3 of the and-invert circuit 10a. An and-invert circuit 10d includes input pins 1, 2, and 3. The output terminals of and-invert circuits 10a and 10b are connected to pin 2 of and-invert circuit 10d. The output terminal of and-invert circuit 10d is connected to pin 1 of and-invert 10a and pin 1 of and-invert 10b. An and-invert circuit 10e includes input pins 1 and 2. Input pin 1 of and-invert circuit 10e is connected to the output terminals of and-invert circuits 10a and 10b. An and-invert circuit 10f includes input pins 1 and 2. Input pin 2 of and-invert circuit 10f is connected to the output terminal of the and-invert circuit 10e. A clock line "+clock" is connected to pin 1 of and-invert circuits 10d and 10f. The output terminal of and-invert circuit 10f is connected to pin 3 of and-invert circuit 10d and to pin 2 of and-invert circuit 10e. The following additional terminals are connected to the output latch 30 via the transfer gate 20: pin 2 and pin 3 of and-invert circuit 10d, the output terminal of inverter 10c, pin 2 of and-invert circuit 10f, and the clock line mentioned hereinabove.

In FIG. 3, the output latch 30 comprises the following elements.

An and-invert circuit 30a includes input pins 1, 2, 3, and 4. Pin 1 of and-invert circuit 30a is connected to input pin 2 of and-invert circuit 10d. Pin 2 of and-invert circuit 30a is connected to input pin 3 of and-invert circuit 10d. Pin 3 of the and-invert circuit 30a is connected to the output of inverter 10c. Pin 4 of and-invert circuit 30a is connected to the clock line "+clock". An and-invert circuit 30b includes input pins 1, 2, and 3. Input pin 1 of and-invert circuit 30b is connected to input pin 3 of and-invert circuit 30a forming a junction 20a, the junction 20a being connected to the output of inverter 10c. Input pin 2 of and-invert circuit 30b is connected to input pin 2 of and-invert circuit 10f. Input pin 3 of and-invert circuit 30b is connected to the clock line "+clock". An output terminal of an inverter circuit 30c is connected to an output terminal of and-invert circuit 30b. An output terminal of an inverter circuit 30d is connected to an output terminal of and-invert circuit 30a. An input terminal of inverter circuit 30d is connected to the output terminal of inverter circuit 30c. The input terminal of inverter circuit 30c is connected to the output terminal of inverter circuit 30d.

The transfer gate 20 includes the junction 20a. Accordingly, junction 20a performs the function of transfer gate 20.

The two input pin and-invert circuits shown in FIG. 3 of the drawings function in accordance with the following truth table:

| input | | output |
|---|---|---|
| 0 | 0 | 1 |
| 0 | 1 | 1 |
| 1 | 0 | 1 |
| 1 | 1 | 0 |

The three input pin and-invert circuits shown in FIG. 3 of the drawings function in accordance with the following truth table:

| input | | | output |
|---|---|---|---|
| 0 | 0 | 0 | 1 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

The truth table associated with the four input pin and-invert circuit 30a shown in FIG. 3 of the drawings is similiar to the above truth tables, that is, the output is 0 when the input is 1 1 1 1 but the output is 1 when the input is any bit combination other than 1 1 1 1.

Figure 4A:
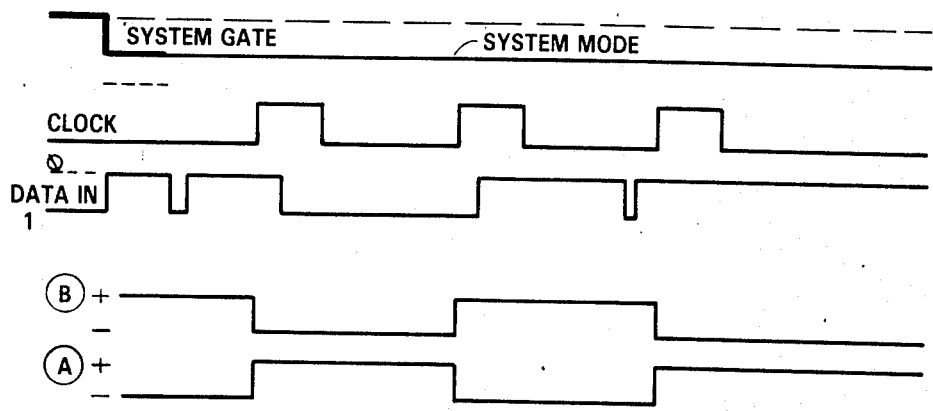
FIGS. 4a and 4b illustrate a plurality of waveforms depicting the functional operation of the embodiment of invention illustrated in FIG. 3 when operating in a system mode and in a scan mode.
Figure 4B:
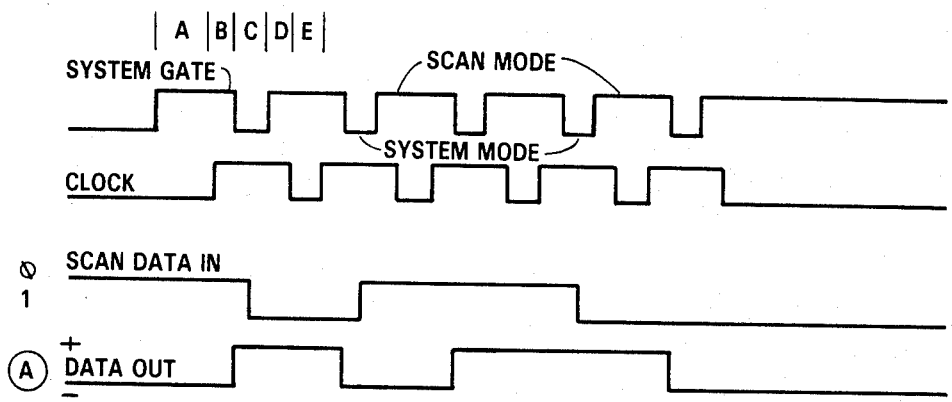

Referring to FIGS. 4a and 4b, a sample set of voltage waveforms is illustrated. In FIG. 4a, this sample set of waveforms is utilized when the latch circuit shown in FIG. 3 is operating in a system mode. In FIG. 4b, this sample set of waveforms is utilized when the latch circuit shown in FIG. 3 is operating in a scan mode. These waveforms may be utilized in conjunction with a desription of the functional operation of the latch circuit of the present invention presented in the following paragraphs.

The functional operation of the latch circuit in accordance with the present invention will be described in the paragraphs below with reference to FIGS. 3, 4a, and 4b of the drawings. However, prior to proceeding with the functional description of the operation of the latch circuit shown in FIG. 3, it would be helpful to broadly describe the manner in which the latch circuit of FIG. 3 performs its locking function.

In brief, the locking capability of the latch circuit of the present invention is implemented by ensuring that pin 2 of and-invert circuit 30a is minus when the clock line becomes plus and when the scan data or the system data, input to circuit 10b or 10a, respectively, is plus and by ensuring that pins 1 and 2 of and-invert circuit 30a are plus when the clock line becomes plus and when the scan data or system data, input to circuits 10b or 10a, respectively, is minus. Pins 1 and 2 of circuit 30a are plus when pin 1 of and-invert circuits 10a and 10b are minus in response to activation of the clock line. When pin 2 of circuit 30a is minus or when pin 1 of circuits 10a and 10b is minus in accordance with the above stated conditions, the output condition of the output latch 30, and in particular, circuit 30a, is locked despite further changes in state or condition of the input system or scan data.

In addition, prior to proceeding with the functional description of the operation of the latch circuit shown in FIG. 3, it would be helpful to broadly describe the relationship between the time period intervals identified by "A", "B", "C", "D", and "E" shown in FIG. 4b.

Intervals "A" through "E" are under the control of the system designer and have the following significance: interval "A" represents the skew of the rise of the system gate to the rise of the clock line; interval "B" represents the skew of the fall of the system gate from the rise of the clock line; interval "C" represents the transfer pulse width; interval "D" represents the system gate release time; and interval "E" represents the clock release and rise time skew.

The detailed functional operation of the latch circuit of the present invention will be described in the following paragraphs.

Assume that the words "plus" and "binary 1" are synonomous and that the words "minus" and "binary 0" are also synonomous. During the system mode of operation, system data energizes the latch circuit of FIG. 3 via the "+sys data in" terminal. The system gate "-sys gate" is minus. As a result, due to the function of inverter 10c pin 3 of and-invert circuit 10a is energized with a plus signal. Pin 2 is energized with the plus system data. Pin 1 is energized with a plus signal since pin 1 of and-invert circuit 10a is connected to the output of and-invert circuit 10d. The output of and-invert circuit 10d is plus because the clock line, at this point in time, is minus. Since pins 1, 2, and 3 of and-invert circuit 10a are plus, the system data appearing at the input of circuit 10a is gated through to the output thereof. As a result, a minus signal appears at the output of and-invert circuit 10a. Therefore, if the system data is a plus, the minus output of and-circuit 10a energizes pin 2 of and-invert circuit 10d. Since pin 2 of and-invert circuit 10d is connected to pin 1 of and-invert circuit 30a, this minus signal energizes pin 1 of and-invert circuit 30a At this point, since the clock line is still minus, if the system data were to change in state, the changed system data would be gated through and-invert circuit 10a and would energize pin 2 of and-invert circuit 10d and pin 1 of and-invert circuit 30a. However, when the clock line becomes plus, pin 1 of and-invert circuit 10d is plus. Pin 2 is already minus due to the system data being gated through and-invert circuit 10a. Pin 3 of and-invert circuit 10d is minus for the following reasons: the minus output of and-invert circuit 10a is communicated to pin 1 of and-invert circuit 10e; therefore, the output of and-invert circuit 10e must be plus; this plus output is communicated to pin 2 of and-invert circuit 30b; since the plus output of and-invert circuit 10e is communicated to pin 2 of and-invert 10f, and since the clock line is plus, the output of and-invert circuit 10f is minus; this minus output is communicated to pin 3 of and-invert circuit 10d. Since the clock line is plus, pin 2 of circuit 10d is minus, and pin 3 of circuit 10d is minus, the output of and-invert circuit 10d is plus. The output of and-invert circuit 10d, being plus, maintains pin 1 of and-invert circuit 10a at a plus state. As noted above, pin 3 of circuit 10d is minus. Since pin 3 of circuit 10d is connected to pin 2 of circuit 30a, pin 2 of circuit 30a is also minus. Therefore, pins 1 and 2 of circuit 30a are minus. If the system data were to change to another state, that is, to a minus, pin 1 of circuit 30a would change to a plus. However, when the clock line becomes plus, pin 2 of circuit 30a would maintain its minus state in spite of the change in state of the system data since the output of circuit 10f would maintain its minus in spite of the change in the output of circuit 10a to the plus state (this is because pin 2 of circuit 10e will maintain its minus state).

Since pin 2 of and-invert circuit 30a maintains its minus state, when the clock line becomes plus, the output of and-invert circuit 30a is locked at the plus state, the state it possessed when the clock line became plus. The output of circuit 30a is locked at a plus state regardless of further changes in state of the system data. When the system data is plus, this is one definition of the locking function performed by the latch circuit of the present invention.

When the system data is minus, the output of and-invert circuit 10a is plus, this plus output being communicated to pin 1 of and-invert circuit 30a. However, the plus output of circuit 10a is communicated to pin 1 of circuit 10e. Since pin 2 of circuit 10e is plus, the output of circuit 10e is minus. Since the output of circuit 10e is connected to pin 2 of circuit 10f, and since the output of circuit 10e. is minus, the output of circuit 10f must be plus. This plus output is communicated to pin 3 of circuit 10d and pin 2 of circuit 30a. When the clock line becomes plus, the output of circuit 10d becomes minus, this minus output being fed back to pin 1 of circuit 10a. Since pin 1 of circuit 10a is minus, the output of circuit 10a must always be a plus regardless of the binary state of the system data being input to circuit 10a. Therefore, pin 1 of circuit 30a will maintain its plus state. Since it has been assumed that the system gate is minus, pin 3 of circuit 30a is plus and, since the clock line is plus, pin 4 of circuit 30a is plus. Therefore, the output of circuit 30a will be changed to a minus.

The output of circuit 30a will be locked at its minus state when the clock line becomes plus, in spite of further changes in state of the system data, due to the minus state being present on pin 1 of circuit 10a. This minus state on pin 1 of circuit 10a ensures that pin 1 of circuit 30a is plus while pin 2 of circuit 30a is plus thereby locking the output of circuit 30a at the minus state. When the system data is minus, this is another definition of the locking function performed by the latch circuit of the present invention.

It should be noted that, when the binary state of pin 1 of circuit 30a is minus, the binary state of pin 2 of circuit 30b is plus, and vice-versa. This is an example of the steering function performed by the latch circuit of the present invention.

During the scan mode, the system gate input is plus. Assuming that the scan data being input to circuit 10b is plus, the output of circuit 10b is minus, since it is assumed that pin 1 of circuit 10b is plus and that pin 3 of circuit 10b is a plus. Pin 3 of circuit 10b is a plus because the system gate is initially a plus thereby allowing the scan data to be gated through circuit 10b. The system gate, being a plus, prevents the output latch 30 from changing when the clock becomes a plus (it will be changed to a minus state again subsequent to a change in the clock line to the plus state). Therefore, a minus appears on pin 2 of circuit 10d and on pin 1 of circuit 30a. At this point, the clock line is minus. Therefore, pin 1 of circuit 10d is minus. Since pins 1 and 2 of circuit 10d are minus, the output of circuit 10d must be plus. This plus output is fed back to pin 1 of circuit 10b. The minus output of circuit 10b is communicated to pin 1 of circuit 10e. Therefore, the output of circuit 10e must be plus. The plus output is communicated to pin 2 of circuit 10f. Since the clock line is still minus, a plus is developed from circuit 10f which is communicated to pin 3 of circuit 10d and pin 2 of circuit 30a. However, when the clock line becomes plus, pin 1 of circuit 10f is plus, and the output of circuit 10f becomes minus. This minus output is communicated to pin 2 of circuit 30a (as well as to pin 3 of circuit 10d). When pin 1 of circuit 30a became minus, the output of circuit 30a became plus. When pin 2 of circuit 30a was plus, a subsequent change in the binary state of the scan data would change the output state of circuit 30a. However, when pin 2 of circuit 30a also became minus in response to a change in the clock line to the plus state, the output of circuit 30a became locked at the plus state regardless of any further changes in the binary state of the scan data.

Therefore, when the clock line becomes plus, pin 2 of circuit 30a is changed to a minus state, and the output of the circuit 30a is locked at the plus state regardless of further changes in binary state of the scan data being input to and-invert circuit 10b.

Assume that the scan data being input to circuit 10b changes to a minus. The output of circuit 10b will be a plus. This plus output is communicated to pin 2 of circuit 10d and to pin 1 of circuit 30a. The plus output from circuit 10b is further communicated to pin 1 of circuit 10e. Since pin 2 of circuit 10e is also plus (the clock line is minus and therefore pin 1 of circuit 10f is minus), the output of circuit 10e is a minus. This minus output is communicated to pin 2 of circuit 10f and to pin 2 of circuit 30b. Pin 1 of circuit 10f is minus since, at this point in time, the clock line is minus. Therefore, the output of circuit 10f is plus, this plus output being communicated to pin 3 of circuit 10d and to pin 2 of circuit 30a. If the clock line becomes plus at this point in time, pin 1 of circuit 10d is changed to a plus. Since pins 1, 2, and 3 of circuit 10d are plus, the output of circuit 10d is minus, this minus output being fed back to pin 1 of circuit 10a and pin 1 of circuit 10b. The minus condition appearing on pin 1 of circuit 10b ensures that the output of circuit 10b is locked at a plus. Since the output of circuit 10a is tied to pin 1 of circuit 30a, when the clock line becomes plus, pin 1 of circuit 30a is locked at the plus state. Pin 2 of circuit 30a is locked at the plus state since the output of circuit 10f is locked at the plus state (the output of circuit 10f is locked at a plus since pin 1 of circuit 10b is locked at a minus forcing the output of circuit 10b to be a plus regardless of the binary state of the scan data). This is another definition of the locking function performed by the present invention. Pin 4 of circuit 30a is a plus since, at this point in time, the clock line is a plus. However, pin 3 is a minus, at this point in time, since the system gate is still plus. When the system gate is minus, the output of circuit 30a is minus since pin 3 of circuit 30a is plus. Therefore, the output of circuit 30a changes to the minus state when the system gate becomes minus while the clock line is already plus.

Referring to FIG. 5, another embodiment of the latch circuit shown in FIG. 2 is illustrated. Due to its similarity with the latch circuit shown in FIG. 3, the components of the latch circuit illustrated in FIG. 5 will be identified by the same feature numerals as were used to identify the components of the FIG. 3 latch circuit.

In FIG. 5, the latch circuit illustrated is identical in construction, in all other respects, to the latch circuit shown in FIG. 3 with the exception of the following differences: the clock line is not connected to and-invert circuits 30a and 30b; an output of and-invert circuit 10f is not connected to an input of and-invert circuit 30a, but the output of circuit 10d is connected to an input of and-invert circuit 30d; the output of and-invert circuit 10f is connected to an input of and-invert circuit 30c; pin 2 of circuit 10d is not connected to pin 1 of circuit 30a; pin 2 of circuit 10f is not connected to pin 2 of circuit 30b; an output of circuit 30a is connected to an input of circuit 30b as well as an input of circuit 30c; an output of circuit 30b is connected to an input of circuit 30a as well as an input of circuit 30d; the system gate being input to inverter 10c is a "plus" system gate (and not a "minus" system gate as shown in FIG. 3) —as a result, a minus must be present at the transfer gate 20a of FIG. 5 to transfer the data present at the input of the output latch 30 to the output latch 30.

The functional operation associated with the latch circuit shown in FIG. 5 is essentially the same as the functional operation of the latch circuit shown in FIG. 3. However, the FIG. 5 latch circuit operates more slowly than does the FIG. 3 latch circuit due to a reduction in the amount of hardware present in the FIG. 5 latch circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A latch circuit including a system data input line, a scan data input line, and a system gate input line, each of the input lines conducting a signal having a binary state, comprising:

selection means responding to the binary state of the signal on the system data input line, the scan data input line, and the system gate input line for selecting either said system data input line or said scan data input line in response to the binary state of the signal on said system gate input line and developing an output signal having the binary state of the selected data input line;

clock pulse conducting input means for conducting clock pulses, each of the clock pulses having a binary state;

circuit means connected to an output of said selection means and responding to the binary state of said output signal from said selection means and to the binary state of a clock pulse conducted via said clock pulse conducting input means for storing the binary state of said output signal from said selection means in response to said binary state of said clock pulse, said circuit means developing an output signal in response to the storage of said binary state of said output signal from said selection means, said selection means receiving said output signal from said circuit means and, in response thereto, forcedly maintaining the development of said output signal from said selection means thereby locking the storage of said binary state of said output signal from said selection means in said circuit means; and output latch means connected to the output of said selection means and responding to said output signal from said selection means, to the binary state of said clock pulse and to the binary state of the signal on said system gate input line for storing said output signal from said selection means therein when the signal on said system gate input line has a predetermined binary state during the development of said clock pulse, said output latch means developing a data out signal, representing an output signal from said latch circuit, in response to the storage of said output signal from said selection means therein.

2. The latch circuit of claim 1, wherein said clock pulse conducting input means consists of a single clock line.

3. A method of energizing a latch circuit during a system mode of operation, said latch circuit including a system data input line, a system gate input line, a clock input line, and an output line, the method comprising the steps of:

receiving a system pulse from said system gate input line and maintaining the reception of said system pulse throughout the duration of said system mode of operation;

receiving data from said system data input line during the reception of said system pulse, said output line of said latch circuit being in an inactive state and remaining in said inactive state when said data is received during the reception of said system pulse; and receiving a clock pulse from said clock input line during the simultaneous reception of said data and said system pulse by said latch circuit, said output line of said latch circuit changing from said inactive state to an active state when said clock pulse is received during the simultaneous reception of said data and said system pulse by said latch circuit.

4. A method of energizing a latch circuit during a scan mode of operation, said latch circuit including a scan data input line, a system gate input line, a clock input line, and an output line, the method comprising the steps of:

receiving data from said scan data input line;

receiving a clock pulse from said clock input line during the reception of said data from said scan data input line, said output line of said latch circuit being in an inactive state and remaining in said inactive state when said clock pulse is received during the reception of said data by said latch circuit; and receiving a scan pulse from said system gate input line during the simultaneous reception of said clock pulse and said data by said latch circuit, said output line of said latch circuit changing from said inactive state to an active state when said scan pulse is received during the simultaneous reception of said clock pulse and said data by said latch circuit.

5. The method of claim 4, further comprising the steps of:

maintaining the reception of said clock pulse by said latch circuit for a period of time after the termination of reception of said scan pulse by said latch circuit thereby compensating for clock skew.

* * * * *